United States Patent
To et al.

(10) Patent No.: US 7,388,795 B1
(45) Date of Patent: Jun. 17, 2008

(54) MODULAR MEMORY CONTROLLER CLOCKING ARCHITECTURE

(75) Inventors: Hing To, Cupertino, CA (US); Mamun Ur Rashid, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/647,656

(22) Filed: Dec. 28, 2006

(51) Int. Cl.
*G11C 7/00* (2006.01)

(52) U.S. Cl. .................... 365/194; 365/233.1; 327/158

(58) Field of Classification Search ................ 365/194, 365/233.1; 327/158, 247
See application file for complete search history.

(56) References Cited

U.S. PATENT DOCUMENTS 7,079,446 B2 * 7/2006 Murtagh et al. ......... 365/233.1
7,209,397 B2 * 4/2007 Ware et al. .................. 365/194

* cited by examiner

*Primary Examiner*—Huan Hoang
(74) *Attorney, Agent, or Firm*—Blakely, Sokoloff, Taylor & Zafman LLP

(57) ABSTRACT

According to one embodiment, a memory controller is disclosed. The memory controller includes a phase locked loop (PLL) to generate a differential reference clock and a first clocking component coupled to the PLL. The first clocking component includes a first delay locked loop (DLL) to receive the reference clock and to generate transmit and receive delay de-skew clock signals, a first set of phase interpolators to provide data transmit de-skewing and a first set of slave delay lines to provide data receive de-skewing.

20 Claims, 9 Drawing Sheets

MODULAR MEMORY CONTROLLER CLOCKING ARCHITECTURE

FIELD OF THE INVENTION

The present invention relates to computer systems; more particularly, the present invention relates to interfacing with memory devices.

BACKGROUND

A memory controller is an integrated circuit located on the motherboard, or processor die, within a computer system that manages the flow of data to and from a main memory device. Particularly, memory controllers include logic necessary to read and write data to dynamic RAM (DRAM). A component of the logic includes a clocking architecture to carry out transactions with the DRAM.

The clocking architecture typically includes special delay locked loops (DLL) that are used to transmit de-skew and receive de-skew. However, the conventional clocking architecture implements a relatively large number of logic components to control all de-skewing for a single memory controller channel.

BRIEF DESCRIPTION OF THE DRAWINGS

The invention is illustrated by way of example and not limitation in the figures of the accompanying drawings, in which like references indicate similar elements, and in which.

DETAILED DESCRIPTION

A modular memory controller clocking architecture is described. In the following detailed description of the present invention numerous specific details are set forth in order to provide a thorough understanding of the present invention. However, it will be apparent to one skilled in the art that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
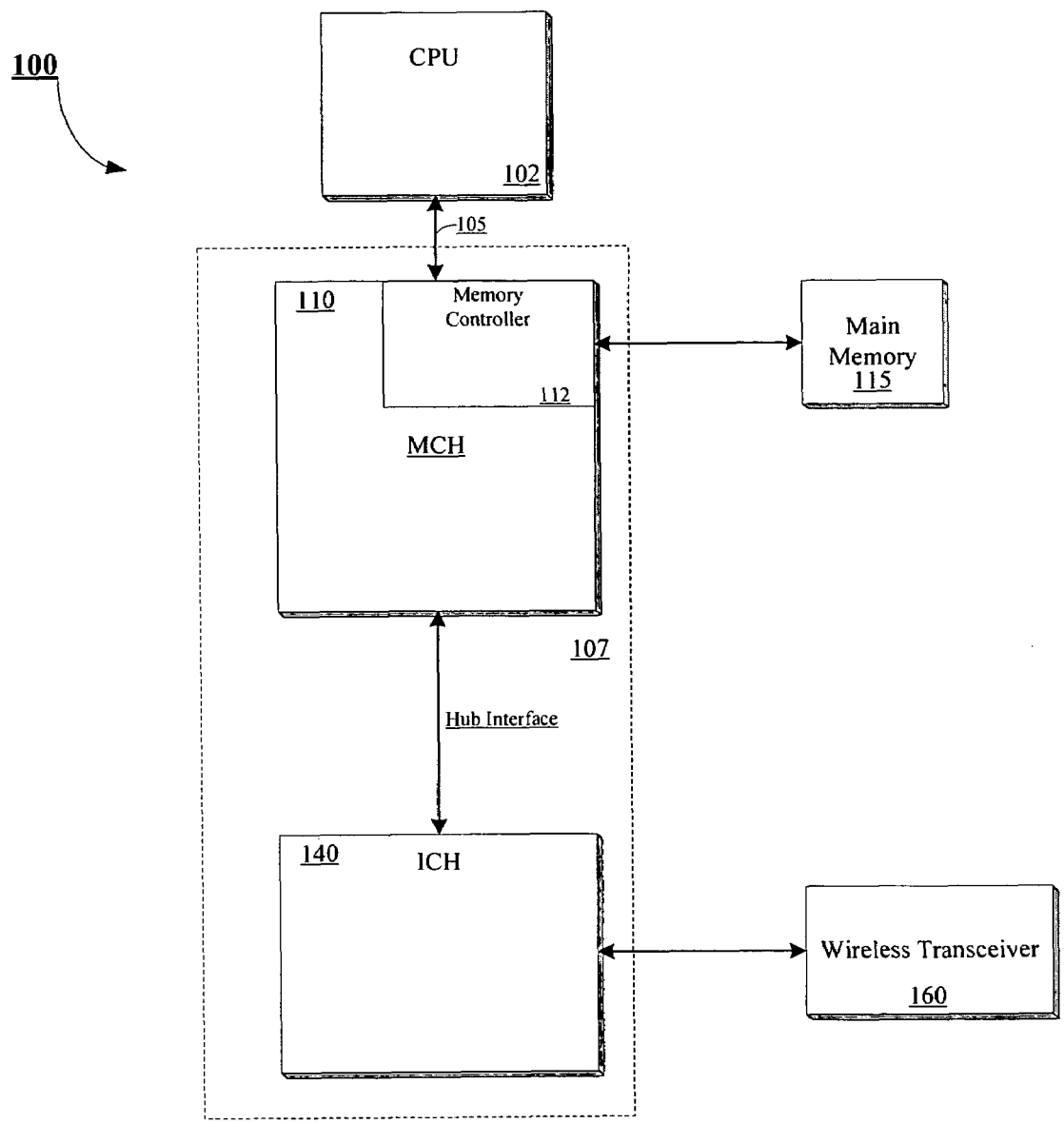
FIG. 1 is a block diagram of one embodiment of a computer system.

FIG. 1 is a block diagram of one embodiment of a computer system 100. Computer system 100 includes a central processing unit (CPU) 102 coupled to interconnect 105. In one embodiment, CPU 102 is a processor in the Pentium® family of processors available from Intel Corporation of Santa Clara, Calif. Alternatively, other CPUs may be used. For instance, CPU 102 may be implemented as multiple processors, or multiple processor cores.

In a further embodiment, a chipset 107 is also coupled to interconnect 105. Chipset 107 may include a memory control hub (MCH) 110. MCH 110 may include a memory controller 112 that is coupled to a main system memory 115. Main system memory 115 stores data and sequences of instructions that are executed by CPU 102 or any other device included in system 100.

In one embodiment, main system memory 115 includes one or more DIMMs incorporating dynamic random access memory (DRAM) devices; however, main system memory 115 may be implemented using other memory types. Additional devices may also be coupled to interconnect 105, such as multiple CPUs and/or multiple system memories.

MCH 110 may be coupled to an input/output control hub (ICH) 140 via a hub interface. ICH 140 provides an interface to input/output (I/O) devices within computer system 100. ICH 140 may support standard I/O operations on I/O interconnects such as peripheral component interconnect (PCI), accelerated graphics port (AGP), universal serial interconnect (USB), low pin count (LPC) interconnect, or any other kind of I/O interconnect (not shown). In one embodiment, ICH 140 is coupled to a wireless transceiver 160.

Figure 7:
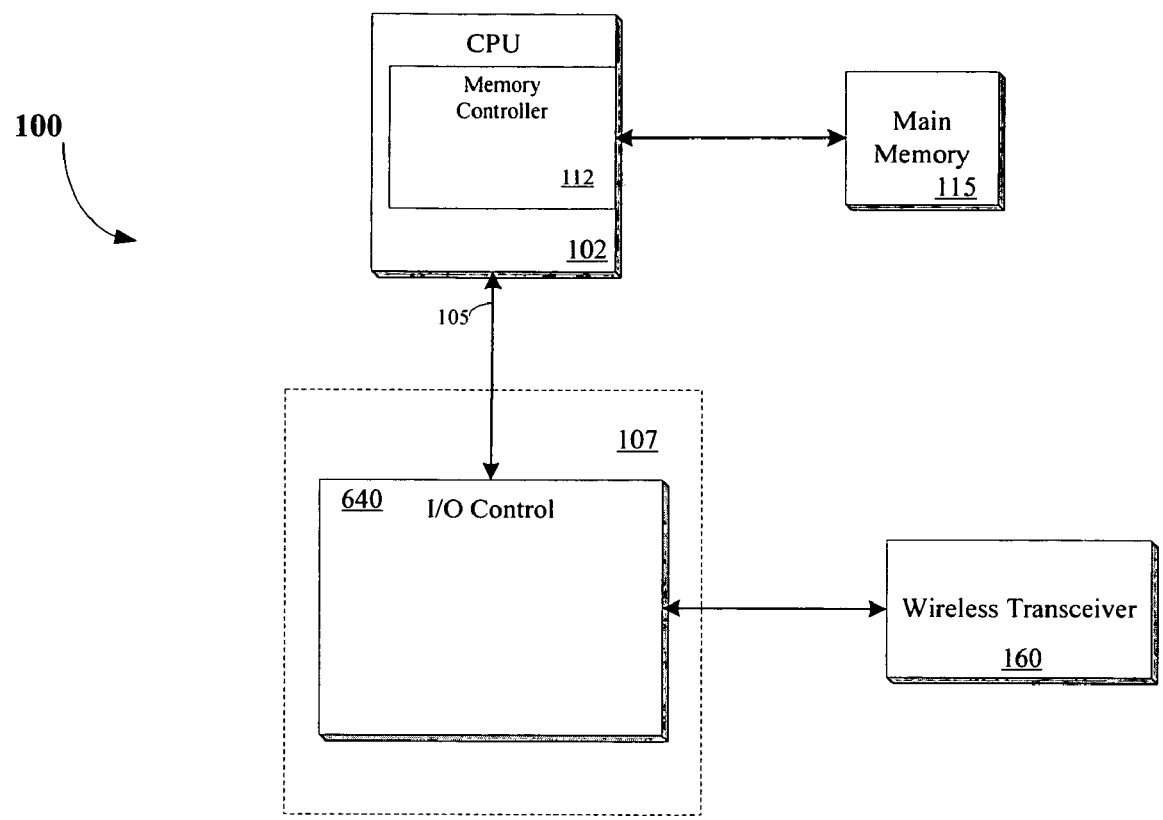
FIG. 7 is a block diagram of another embodiment of a computer system.

FIG. 7 illustrates another embodiment of computer system 100. In this embodiment, memory controller 112 is included within CPU 102. As a result, memory 115 is coupled to CPU 102. Further chipset 107 includes a control hub 740.

Figure 2A:
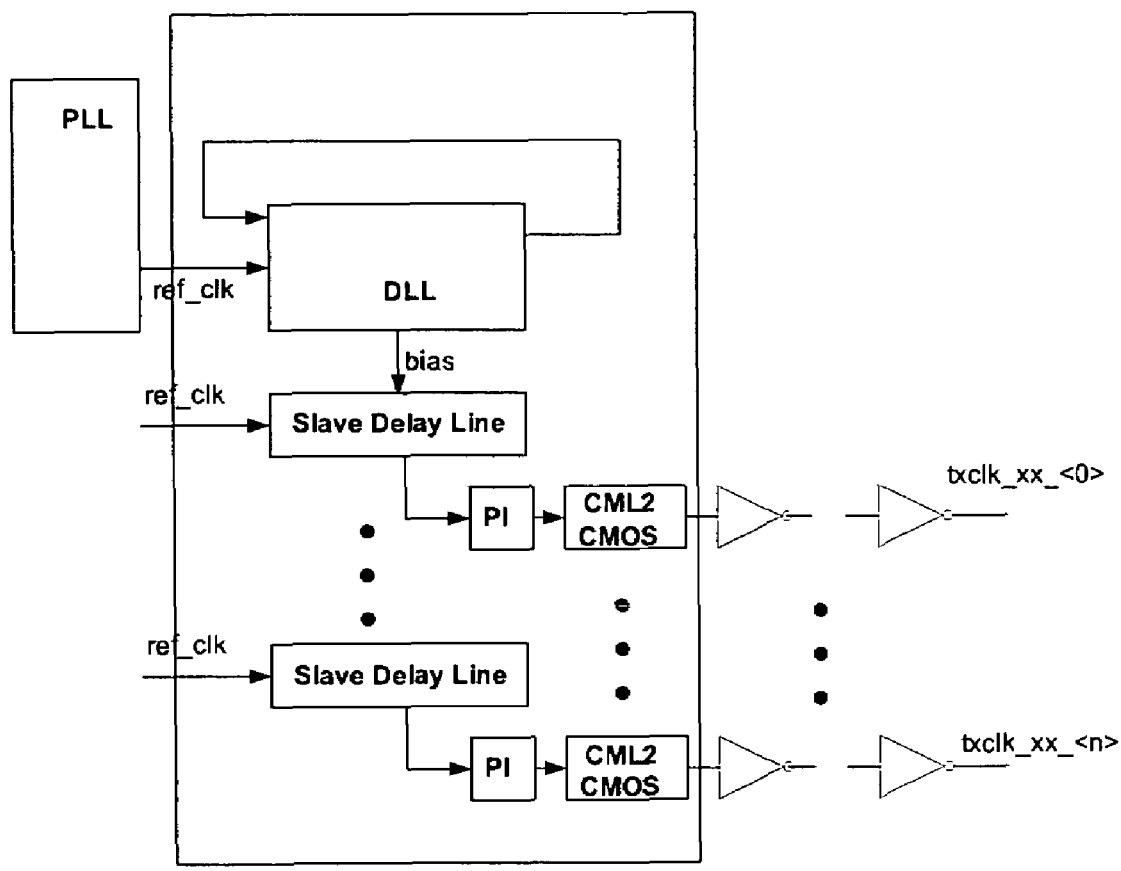
FIGS. 2A and 2B illustrate a conventional transmit delay locked loop architecture.

Notwithstanding the embodiment, memory controller performs memory transactions with main memory 115 by transferring data between computer system 100 and memory 115. To perform the memory transactions, memory controller 112 includes a clocking mechanism having delay locked loops (DLL) that are used to transmit de-skew and receive de-skew. FIG. 2A illustrates a conventional transmit delay locked loop architecture.

On the transmit side shown in FIG. 2A, the mechanism includes a DLL coupled to a phase locked loop (PLL) and several slave delay lines. A delay locked loop serves as a component to maintain delay tracking over PVT. Each slave delay line is coupled to a phase interpolator (PI) and a CMOS converter, which is further coupled to a transmitter.

The DLL sets the requisite delay in each of a number of delay elements within the DLL. This delay tracks Process, Voltage & Temperature (PVT) variations, is converted to an analog voltage (bias) and coupled to the slave delay lines. The PI coupled to each slave delay line creates a finer step of the delay and distributes the resultant clocks to each of the high speed 10 transmitters, such as the Stub Series Termination Logic (SSTL) driver.

Figure 2B:
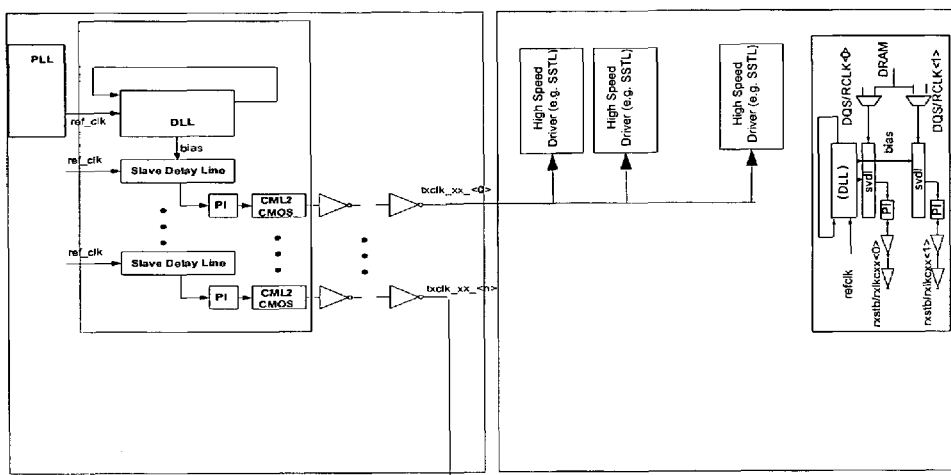
Figure 2B:
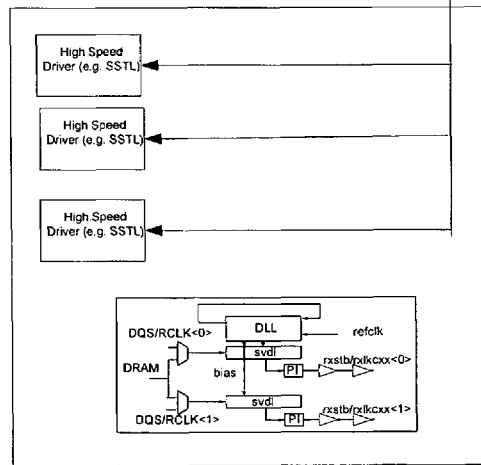
Figure 3:
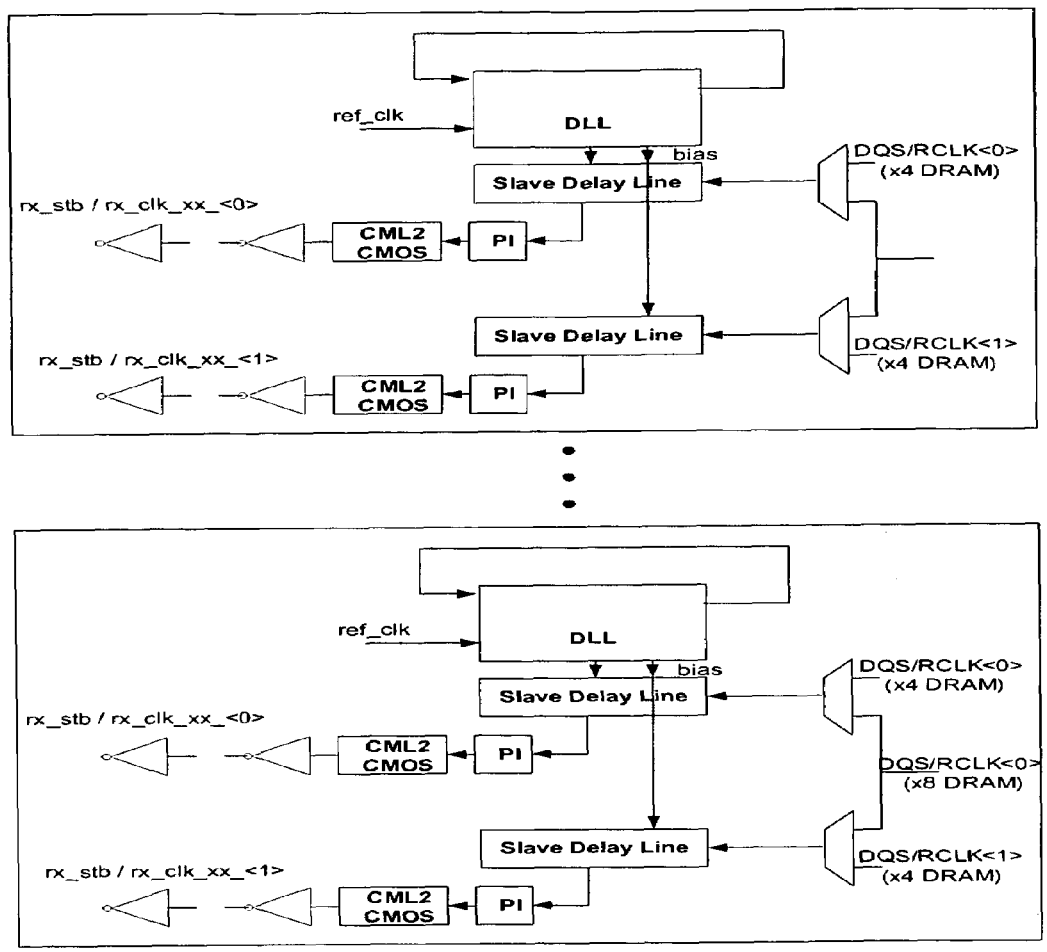
FIG. 3 illustrates a conventional receive delay locked loop architecture.

In a memory controller implementing a conventional clocking mechanism, there are typically eleven groups of transmitters that are skewed independently. Hence, there are eleven slave delay lines and corresponding clock buffers in the transmit direction. These clocking circuitries are located at a centralized location, as shown in FIG. 2B. Thus, the conventional clocking mechanism features the physical locations of the High Speed Drivers being far away from the clocking circuitry (e.g. ~3000 um away) in the original design FIG. 3 illustrates a conventional receive delay locked loop architecture. On the receive side, there are slave delay lines receiving a channel strobe or clock from the DRAMs. The slave delay lines are pre-programmed to a specific delay such that the internal strobe or clock would be center strobe with respect to the receive data. Another DLL and slave delay lines are used to create the requisite delay for every 8 bits (or byte) of receiving data. In a typical one channel memory controller, there are 8 bytes of receiving data. As a result, there will be eight sets of slave delay lines.

The problem with the conventional memory controller clocking mechanism is that the memory controller uses a total of nine DLLs & nineteen slave delay lines to control all of the de-skewing in a one channel memory controller. Further, the transmit deskew delays are generated at one location and then transmitted to the individual I/O transmitters, which are far away from the generation location. This results in area and power inefficiencies, as well as lost deskew setting accuracy when the data rate is scaled up.

According to one embodiment, memory controller 112 includes a clocking architecture for both transmit and receive clock circuitries that reduces the number of delay locked loops and the number of slave delay lines, resulting in a reduction in silicon area and power, while providing comparable to better resolution to the conventional mechanism.

Figure 4A:
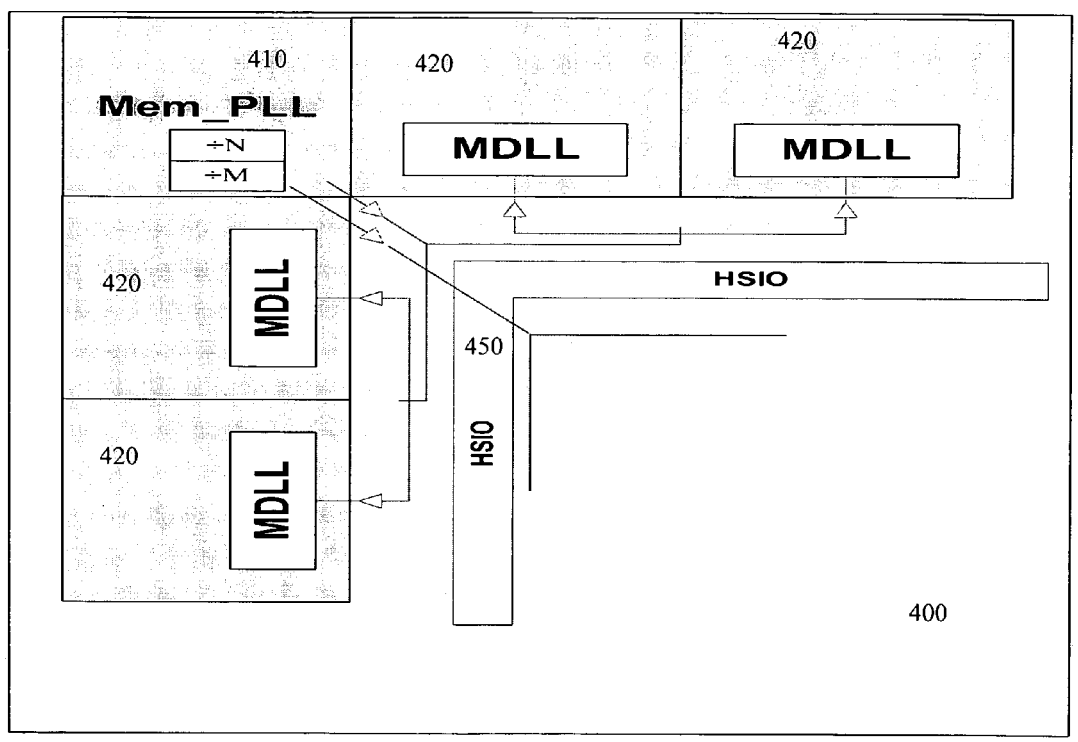
FIGS. 4A and 4B illustrate one embodiment of a global clocking architecture.

FIG. 4A illustrates one embodiment of a global clocking mechanism 400. Clocking mechanism 400 includes a PLL 410 and data/command modules 420. Each module 420 includes a Master DLL (MDLL). According to one embodiment, a PLL 410 supplies a true differential reference clock to the MDLLs that provides a low jitter reference clock. Clocking mechanism 400 also includes high speed input/output (HSIO) interfaces that facilitate data transfers with memory 112.

Figure 4B:
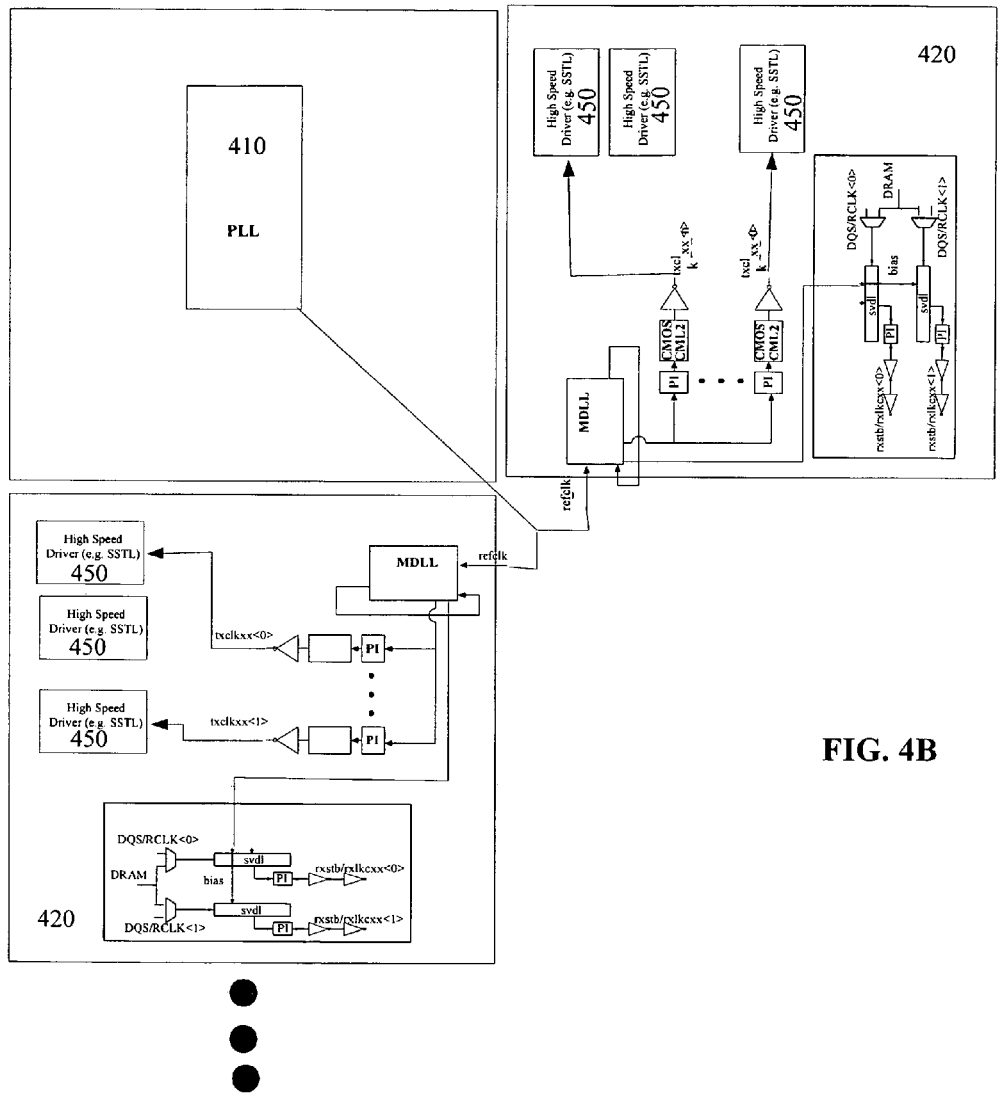

FIG. 4B illustrates another embodiment of global clocking mechanism 400, where the location of the MDLL in each module 420 has a location to enable share between the transmit and receive circuitry. This feature improves accuracy, the number of clock components and power.

Figure 5:
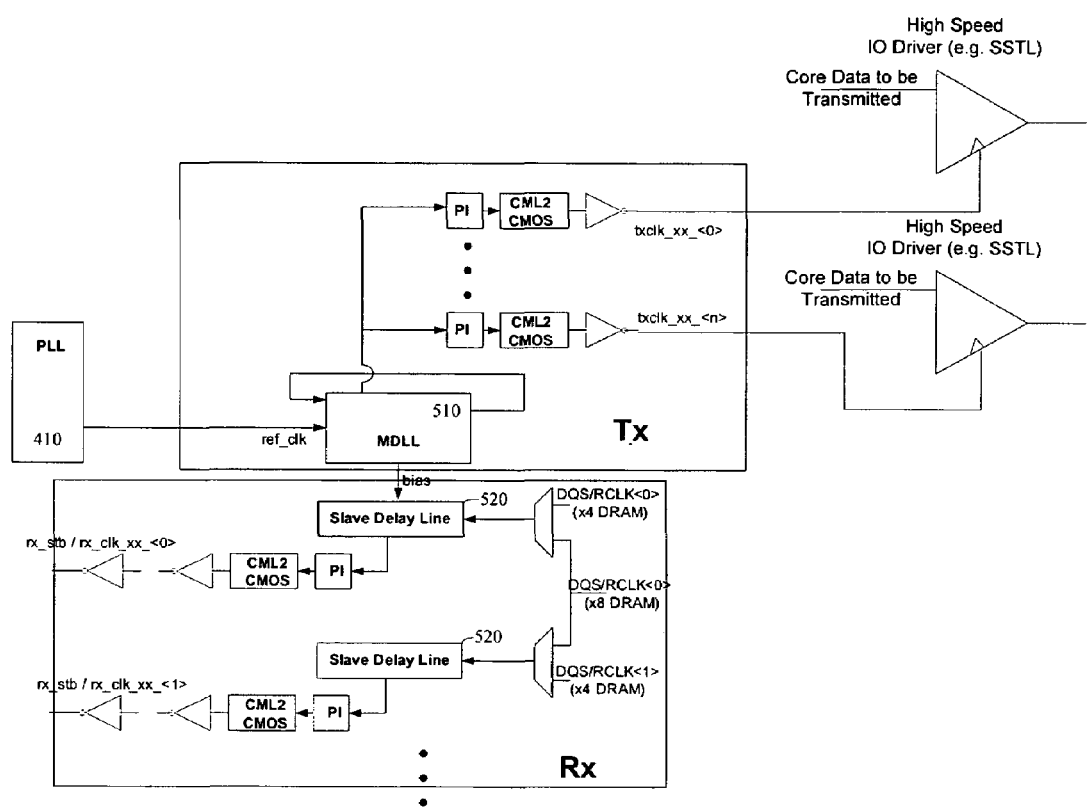
FIG. 5 illustrates one embodiment of a modular clocking architecture.

FIG. 5 illustrates one embodiment of a module 420 coupled to PLL 410. As shown in FIG. 5, module 420 includes both transmit and receive clocking circuitry. The transmit side is shown on the top half component of FIG. 5, while the receive side is shown as the bottom half component. Module 420 includes MDLL 510, slave delay lines 520, as well as additional components (e.g., PIs, converters, etc.).

On the transmit side of module 420, MDLL 510 generates de-skew clocks together with a set of PIs as well as maintaining the required delay. The PIs are now used for transmit bit de-skew. Therefore in one embodiment, eleven PIs are implemented, as opposed to the eleven slave delay lines employed in conventional transmit clocking components. Because the size of each PI is smaller than each slave delay line, there is a reduction in the silicon area needed to fabricate module 420.

In one embodiment, the delay generated by MDLL 510 is converted to an analog bias voltage, as shown in FIG. 5. The bias voltage is connected to slave delay lines 520 for data receiving de-skewing. In such an embodiment, no additional DLL is required for the receive directions, which further reduces the needed silicon area.

Figure 6:
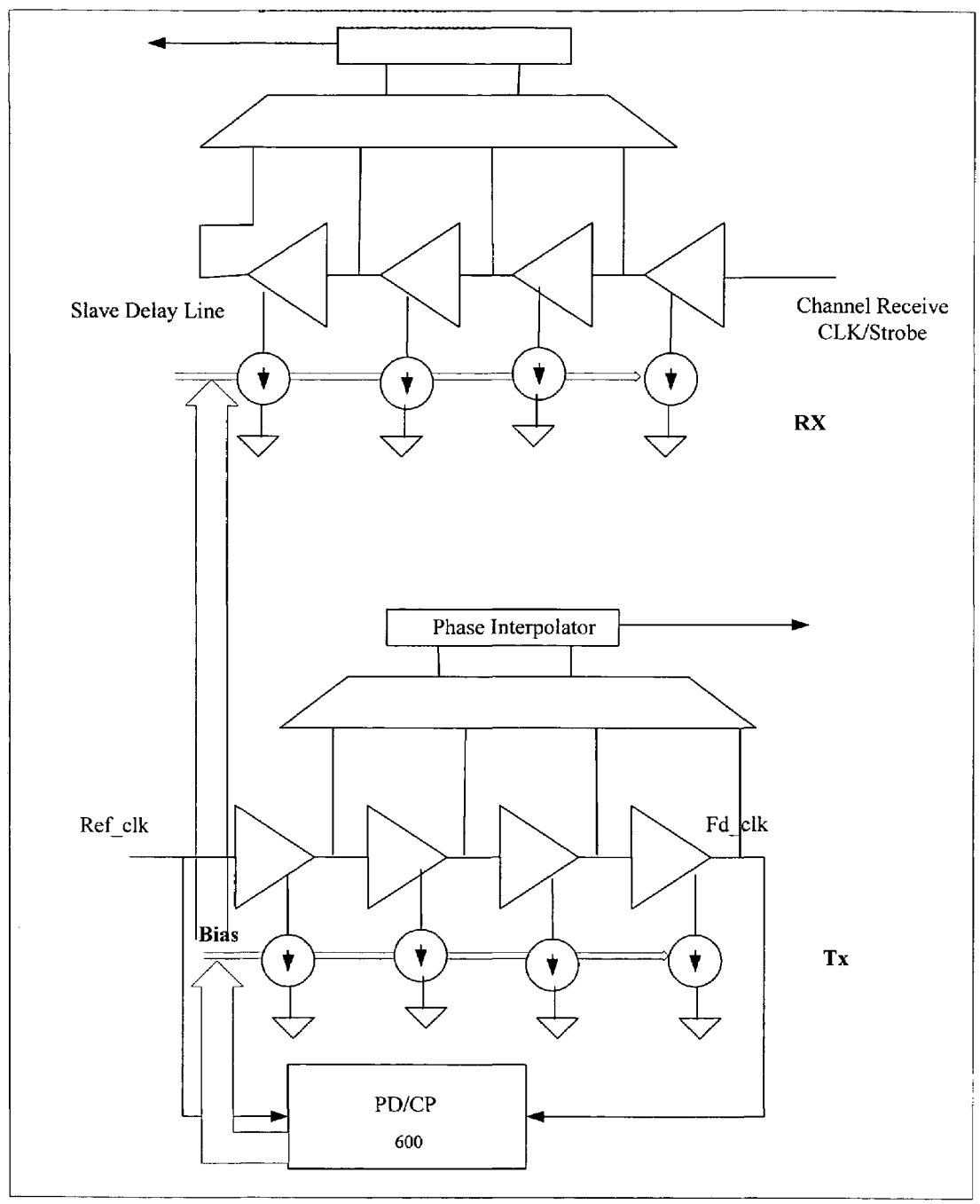
FIG. 6 illustrates another embodiment of a modular clocking architecture.

FIG. 6 illustrates one embodiment of a detailed view of module 420. The transmit component at the bottom of FIG. 6 shows a phase deductor (PD) 600 and delay elements of MDLL 510. Each of delay elements, other than the last, has its output coupled to the next delay element and a multiplexer. The last delay element has an output coupled to the multiplexer and PD 600. Thus, the PI is capable of receiving, via the multiplexer, the full delay setting of all of the delay elements, or finer delay settings.

The bias voltage is then transmitted from the transmit component to the slave delay line 520 of the receive component. The slave delay lines also include delay elements coupled to a PI via a multiplexer. The slave delay lines receive a channel receive/clock strobe.

As shown above, the modular clocking mechanism enables a reduction of the number DLLs from nine to four, and the number of slave delay lines from nineteen to eight. The de-skew resolution is provided back by the additional PIs. Therefore, the modular clocking mechanism has a superior power to data rate scaling than conventional architectures due to the optimal and efficient use of circuit components.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as essential to the invention.

What is claimed is:

1. A memory controller comprising:
   a phase locked loop (PLL) to generate a differential reference clock; and
   a first clocking component, coupled to the PLL, including:
      a first delay locked loop (DLL) to receive the reference clock and to generate transmit and receive delay de-skew clock signals;
      a first set of phase interpolators to provide data transmit de-skewing; and
      a first set of slave delay lines to provide data receive de-skewing.

2. The memory controller of claim 1 further comprising a second clocking component, coupled to the PLL, including:
   a second delay locked loop (DLL) to receive the reference clock and to generate transmit and receive delay de-skew clock signals;
   a second set of phase interpolators to provide data transmit de-skewing; and
   a second set of slave delay lines to provide data receive de-skewing.

3. The memory controller of claim 1 further comprising high speed input/output circuitry coupled to the first and second clocking components.

4. The memory controller of claim 1 wherein the first DLL comprises:
   a set of delay elements to receive the reference clock and to delay the reference clock; and
   a phase deductor to receive the delayed reference clock and to generate a bias voltage.

5. The memory controller of claim 4 wherein the bias voltage is provided to the first set of slave delay lines.

6. The memory controller of claim 4 further comprising a multiplexer coupled between the set of delay elements and a PI.

7. The memory controller of claim 5 wherein the first set of slave delay lines comprise a second set of delay elements to receive a strobe clock and to delay the strobe clock.

8. The memory controller of claim 1 wherein the PLL provides a low jitter reference clock.

9. A method comprising:
   a delay locked loop (DLL) receiving a differential reference clock from a phase locked loop (PLL); and the DLL generating transmit and receive delay de-skew clock signals;

a set of phase interpolators transmitting data providing transmit de-skewing; and a set of slave delay lines providing data receive de-skewing.

10. The method of claim 9 wherein the DLL generating delay de-skew clock signals comprises:

receiving the reference clock at a set of delay elements within the DLL; and delaying the reference clock.

11. The method of claim 10 further comprising receiving the delayed reference clock at a phase deductor.

12. The method of claim 11 further comprising the phase deductor generating a bias voltage.

13. The method of claim 12 further comprising receiving the bias voltage at the set of slave delay lines.

14. A computer system comprising:

a dynamic random access memory (DRAM); and memory controller coupled to the DRAM, including:

a phase locked loop (PLL) to generate a differential reference clock; and a first clocking component, coupled to the PLL, having:

a first delay locked loop (DLL) to receive the reference clock and to generate transmit and receive delay de-skew clock signals;

a first set of phase interpolators to provide data transmit de-skewing; and a first set of slave delay lines to provide data receive de-skewing.

15. The computer system of claim 14 wherein the memory controller further comprises a second clocking component, coupled to the PLL, including:

a second delay locked loop (DLL) to receive the reference clock and to generate transmit and receive delay de-skew clock signals;

a second set of phase interpolators to provide data transmit de-skewing; and a second set of slave delay lines to provide data receive de-skewing.

16. The computer system of claim 14 wherein the memory controller further comprises high speed input/output circuitry coupled to the first and second clocking components.

17. The computer system of claim 14 wherein the first DLL comprises:

a set of delay elements to receive the reference clock and to delay the reference clock; and a phase deductor to receive the delayed reference clock and to generate a bias voltage.

18. The computer system of claim 17 wherein the bias voltage is provided to the first set of slave delay lines.

19. The computer system of claim 17 wherein the memory controller further comprises a multiplexer coupled between the set of delay elements and a PI.

20. The computer system of claim 18 wherein the first set of slave delay lines comprise a second set of delay elements to receive a strobe clock and to delay the strobe clock.

* * * * *